(12) United States Patent
Cho et al.

(10) Patent No.: US 11,092,864 B2
(45) Date of Patent: Aug. 17, 2021

(54) DISPLAY PANEL AND DISPLAY DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventors: En-Tsung Cho, Chongqing (CN); Yiqun Tian, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 59 days.

(21) Appl. No.: 16/612,341

(22) PCT Filed: May 22, 2017

(86) PCT No.: PCT/CN2017/085263
§ 371 (c)(1),
(2) Date: Nov. 8, 2019

(87) PCT Pub. No.: WO2018/205303
PCT Pub. Date: Nov. 15, 2018

(65) Prior Publication Data
US 2020/0096827 A1 Mar. 26, 2020

(30) Foreign Application Priority Data
May 12, 2017 (CN) .......................... 201710342080.2

(51) Int. Cl.
*G02F 1/1362* (2006.01)
*G02F 1/1333* (2006.01)
(Continued)

(52) U.S. Cl.
CPC .. *G02F 1/136277* (2013.01); *G02F 1/133345* (2013.01); *H01L 27/1222* (2013.01); *H01L 29/78684* (2013.01)

(58) Field of Classification Search
CPC .......... H01L 27/1222; H01L 29/78684; G02F 1/136277; G02F 1/133345
(Continued)

(56) References Cited

U.S. PATENT DOCUMENTS

| 6,512,269 B1 | 1/2003 | Bryant et al. |
| 2003/0049892 A1 | 3/2003 | Yamaguchi et al. |

(Continued)

FOREIGN PATENT DOCUMENTS

| CN | 1379914 A | 11/2002 |
| CN | 1388591 A | 1/2003 |

(Continued)

*Primary Examiner* — Igwe U Anya
(74) *Attorney, Agent, or Firm* — Muncy, Geissler, Olds & Lowe, P.C.

(57) ABSTRACT

A display panel and a display device are provided. The display panel includes a substrate; a first metal layer disposed on the substrate; an insulating layer disposed on the first metal layer; a semiconductor layer disposed on the insulating layer and including a germanium-doped semiconductor compound; and a second metal layer disposed on the semiconductor layer. A mobility of the semiconductor compound is greater than a mobility of amorphous silicon.

16 Claims, 5 Drawing Sheets

(51) Int. Cl.
*H01L 27/12* (2006.01)
*H01L 29/786* (2006.01)

(58) Field of Classification Search
USPC .......................................................... 257/88
See application file for complete search history.

(56) References Cited

U.S. PATENT DOCUMENTS

| 2010/0051934 | A1* | 3/2010 | Choung | ................ | H01L 27/124 |
| | | | | | 257/43 |
| 2012/0248452 | A1* | 10/2012 | Yeo | ........................ | G06F 3/0412 |
| | | | | | 257/60 |
| 2019/0067422 | A1* | 2/2019 | Cho | ....................... | H01L 29/161 |

FOREIGN PATENT DOCUMENTS

| CN | 101044625 A | 9/2007 |
| CN | 101086968 A | 12/2007 |
| CN | 101836298 A | 9/2010 |
| CN | 202178260 U | 3/2012 |
| CN | 105355593 A | 2/2016 |

\* cited by examiner

DISPLAY PANEL AND DISPLAY DEVICE

BACKGROUND

Technology Field

This disclosure relates to a display, and more particularly to a display panel, a process of manufacturing the display panel and a display device.

Description of Related Art

The liquid crystal display has many advantages, such as the thin body, low power consumption, and no radiation, and is widely applied. Most of the liquid crystal displays available in the market are backlight type liquid crystal displays each including a liquid crystal panel and a backlight module. The working principle of the liquid crystal panel is to place the liquid crystal between two parallel glass substrates, and to apply a driving voltage to the two glass substrates to control the orientation of the liquid crystal, and refract the light emitted from the backlight module to generate an image frame.

The thin-film-transistor liquid crystal display (TFT-LCD) has the properties including the low power consumption, excellent frame quality and higher production yield, and has gradually become the most popular product in the display field. Similarly, the TFT-LCD includes a liquid crystal panel and a backlight module. The liquid crystal panel includes a color filter substrate (CF substrate) and a thin-film-transistor substrate (TFT substrate). The opposite inner sides of the above substrates are configured with transparent electrodes, respectively. A layer of liquid crystal (LC) is interposed between the two substrates. The liquid crystal panel controls the orientation of the liquid crystal through the electric field to change the polarization state of light, and a polarizer is adopted to implement the transmission and obstruction of the light path and thus the displaying objectives.

In addition, an organic light-emitting diode (OLED) display adopts the self-emissive organic light emitter diodes to display, and has advantages comprising the self-emissive property, the wide viewing angle, the almost infinitely high contrast ratio, the lower power consumption and the extremely high response speed.

The OLED display also needs to be controlled by thin film transistors. However, the thin film transistor having the conventional amorphous silicon structure has the lower mobility, and cannot be applied to OLED display.

SUMMARY

An objective of this disclosure is to provide a display panel for improving the mobility of a semiconductor layer.

Another objective of this disclosure is to provide a display device, which improves the mobility of a semiconductor layer.

In order to solve the above-mentioned problems, an embodiment of this disclosure provides a display panel.

The display panel comprises:
a substrate having a plurality of pixel areas;
a first metal layer disposed on the substrate;
an insulating layer disposed on the first metal layer,
a semiconductor layer disposed on the insulating layer and comprising a germanium-doped semiconductor compound;
a second metal layer disposed on the semiconductor layer;

the mobility of the semiconductor compound is greater than the mobility of amorphous silicon.

Furthermore, the semiconductor compound of the semiconductor layer is an oxygen-rich germanium compound.

Furthermore, the semiconductor compound of the semiconductor layer is an oxygen-rich germanium-silicon compound.

Furthermore, the semiconductor layer comprises:
an active layer disposed on the insulating layer;
an N-typed doped layer disposed on the active layer;
the active layer comprises a germanium-doped semiconductor compound.

Furthermore, the semiconductor compound of the active layer is an oxygen-rich germanium compound.

Furthermore, the semiconductor compound of the active layer is an oxygen-rich germanium-silicon compound.

Furthermore, the N-typed doped layer comprises an oxygen-rich germanium compound or an oxygen-rich germanium-silicon compound.

Furthermore, the insulating layer comprises an oxygen-rich germanium-silicon compound.

Furthermore, the semiconductor layer comprises an active layer disposed on the insulating layer and an N-typed doped layer disposed on the active layer. The second metal layer is covered with a passivation layer. The second metal layer comprises a source metal layer and a drain metal layer disposed on the N-typed doped layer. A trench is also provided above the active layer, and the trench blocks the source metal layer from the drain metal layer and the N-typed doped layer.

The insulating layer comprises an oxygen-rich germanium-silicon compound. Both the active layer and the N-typed doped layer comprise a germanium-doped semiconductor compound.

Germanium (Ge) is a kind of gray and white metal, is shiny and hard, belongs to the carbon family, and has chemical properties similar to those of the same family. In nature, germanium has five isotopes, and the atomic weight is between 70 and 76. It can be formed into many different organometallic compounds. The electroconductive ability of germanium is superior to the general non-metal and inferior to the general metal, has the melt density of 5.32 $g/cm^3$, and has good semiconductor properties, such as the electron mobility and hole mobility. The germanium is doped into the semiconductor layer of the thin film transistor. It can effectively improve the mobility to satisfy the requirement of the OLED display.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1:
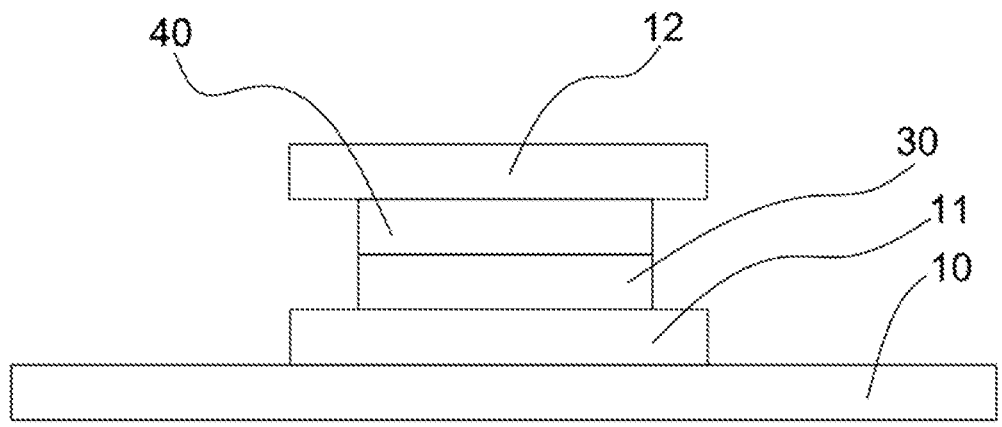
FIG. 1 is a schematic structure view showing a display panel according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

In the drawings, structurally similar units are represented by the same reference numerals.

A display panel and a display device of this disclosure will be described in further detail below with reference to FIGS. 1 to 7 and the preferred embodiments.

Referring to FIG. 1, a display panel disclosed in this embodiment comprises: a substrate 10; a first metal layer 11 disposed on the substrate 10; an insulating layer 30 disposed on the first metal layer 11; a semiconductor layer 40 disposed on the insulating layer 30 and comprising a germanium-doped semiconductor compound; and a second metal layer 12 disposed on the semiconductor layer 40. The mobility of the semiconductor compound is greater than the mobility of amorphous silicon.

In general, the mobility of the amorphous silicon thin film transistor (a-Si TFT) is lower and smaller than 1 $cm^2/V\text{-}s$. The mobility of the semiconductor compound doped with germanium can be greater than 1 $cm^2/V\text{-}s$, or even greater than 2 $cm^2/V\text{-}s$. Germanium (Ge) is a kind of gray and white metal, is shiny and hard, belongs to the carbon family, and has chemical properties similar to those of the same family. In nature, germanium has five isotopes, and the atomic weight is between 70 and 76. It can be formed into many different organometallic compounds. The electroconductive ability of germanium is superior to the general non-metal and inferior to the general metal, has the melt density of 5.32 $g/cm^3$, and has good semiconductor properties, such as the electron mobility and hole mobility. The germanium is doped into the semiconductor layer of the thin film transistor. It can effectively improve the mobility to satisfy the requirement of the OLED display.

Referring to FIG. 1, a display panel of the disclosure includes a substrate 10, a first metal layer 11 disposed on the substrate 10, an insulating layer 30 disposed on the first metal layer 11, a semiconductor layer 40 disposed on the insulating layer 30 and including a germanium-doped semiconductor compound, and a second metal layer 12 disposed on the semiconductor layer 40. The mobility of the semiconductor compound is greater than the mobility of amorphous silicon.

The semiconductor compound of the semiconductor layer 40 is an oxygen-rich germanium compound or an oxygen-rich germanium-silicon compound. The annealing temperatures (Depo. Temp) of these compounds generally range between 170° C. and 370° C.

The oxygen-rich germanium compound comprises, but without limitation to: $GeO_x$; $GeN_x$; $GeO_xN_y$; $GeC_x$; $GeO_xC_y$; and $GeO_xN_yC_z$.

The oxygen-rich germanium-silicon compound comprises, but without limitation to: $SiGeO_x$; $SiGeO_xN_y$; $SiGeN_x$; $SiGeO_xC_y$; $SiGeC_x$; and $SiGeO_xN_yC_z$.

The semiconductor layer 40 includes an active layer 41 disposed on the insulating layer 30 and an N-typed doped layer 42 disposed on the active layer 41. The active layer 41 includes a germanium-doped semiconductor compound.

The semiconductor compound of the active layer 41 is an oxygen-rich germanium compound or an oxygen-rich germanium-silicon compound. The annealing temperatures (Depo. Temp) of these compounds generally range between 170° C. and 370° C.

The oxygen-rich germanium compound comprises, but without limitation to: $GeO_x$; $GeN_x$; $GeO_xN_y$; $GeC_x$; $GeO_xC_y$; and $GeO_xN_yC_z$.

The oxygen-rich germanium-silicon compound comprises, but without limitation to: $SiGeO_x$; $SiGeO_xN_y$; $SiGeN_x$; $SiGeO_xC_y$; $SiGeC_x$; and $SiGeO_xN_yC_z$.

Figure 2:
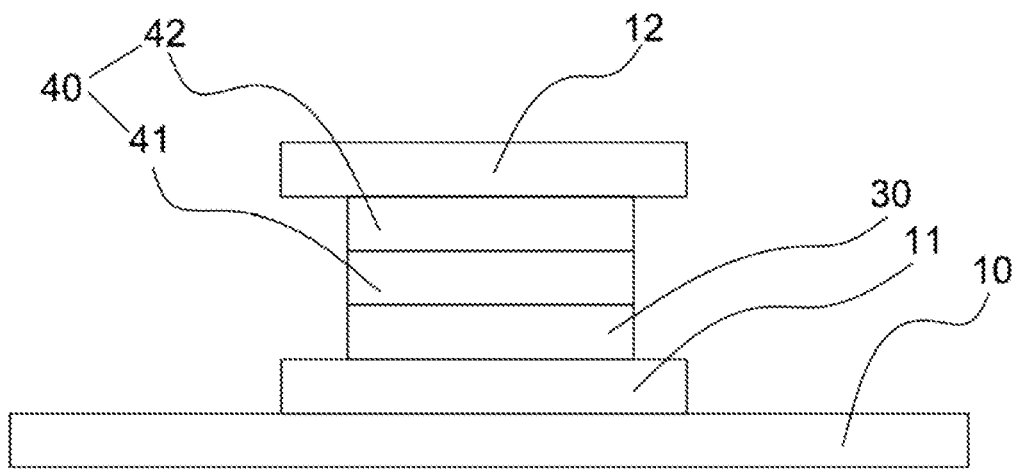
FIG. 2 is a schematic structure view showing a display panel according to another embodiment of this disclosure.

Referring to FIG. 2, a display panel of the disclosure includes a substrate 10, a first metal layer 11 disposed on the substrate 10, an insulating layer 30 disposed on the first metal layer 11, a semiconductor layer 40 disposed on the insulating layer 30 and including a germanium-doped semiconductor compound, and a second metal layer 12 disposed on the semiconductor layer 40. The mobility of the semiconductor compound is greater than the mobility of amorphous silicon.

The semiconductor layer 40 comprises an active layer 41 disposed on the insulating layer 30 and an N-typed doped layer 42 disposed on the active layer 41. The active layer 41 and the N-typed doped layer 42 comprise the germanium-doped semiconductor compound.

The semiconductor compound of the active layer 41 and the N-typed doped layer 42 is an oxygen-rich germanium compound or an oxygen-rich germanium-silicon compound. The annealing temperatures (Depo. Temp) of these compounds generally range between 170° C. and 370° C.

The oxygen-rich germanium compound comprises, but without limitation to: GeOx; GeNx; GeOxNy; GeCx; GeOxCy; and GeOxNyCz.

The oxygen-rich germanium-silicon compound comprises, but without limitation to: SiGeOx; SiGeOxNy; SiGeNx; SiGeOxCy; SiGeCx; and SiGeOxNyCz.

Referring to FIGS. 1 and 2, a display panel of the disclosure includes a substrate 10, a first metal layer 11 disposed on the substrate 10, an insulating layer 30 disposed on the first metal layer 11, a semiconductor layer 40 disposed on the insulating layer 30 and including a germanium-doped semiconductor compound, and a second metal layer 12 disposed on the semiconductor layer 40. The mobility of the semiconductor compound is greater than the mobility of amorphous silicon.

The semiconductor layer 40 comprises an active layer 41 disposed on the insulating layer 30 and an N-typed doped layer 42 disposed on the active layer 41. The active layer 41 and the N-typed doped layer 42 comprise the oxygen-rich germanium compound or the oxygen-rich germanium-silicon compound. The insulating layer 30 comprises the oxygen-rich germanium-silicon compound. The annealing temperatures (Depo. Temp) of these compounds generally range between 170° C. and 370° C.

The oxygen-rich germanium compound comprises, but without limitation to: GeOx; GeNx; GeOxNy; GeCx; GeOxCy; and GeOxNyCz.

The oxygen-rich germanium-silicon compound comprises, but without limitation to: SiGeOx; SiGeOxNy; SiGeNx; SiGeOxCy; SiGeCx; and SiGeOxNyCz.

Figure 3:
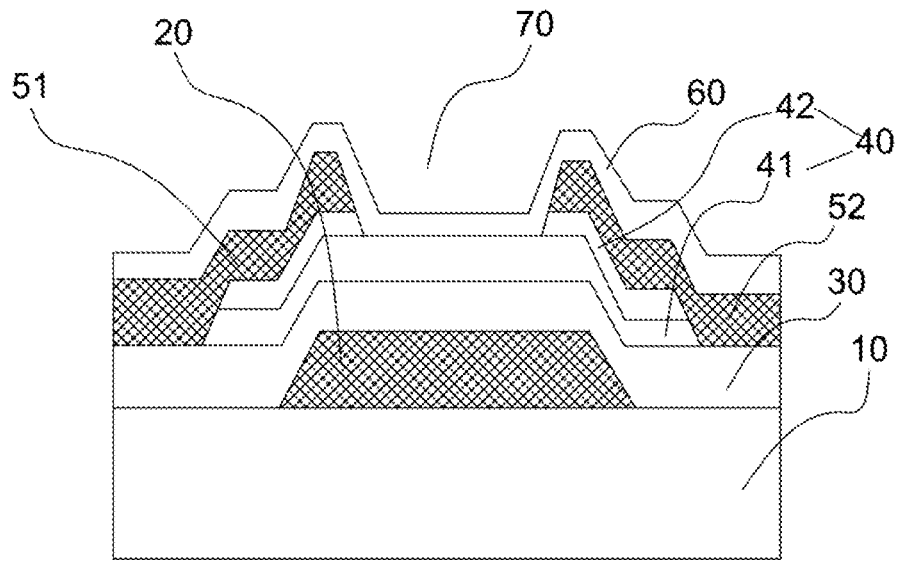
FIG. 3 is a schematic structure view showing a display panel according to another embodiment of this disclosure.
Figure 4:
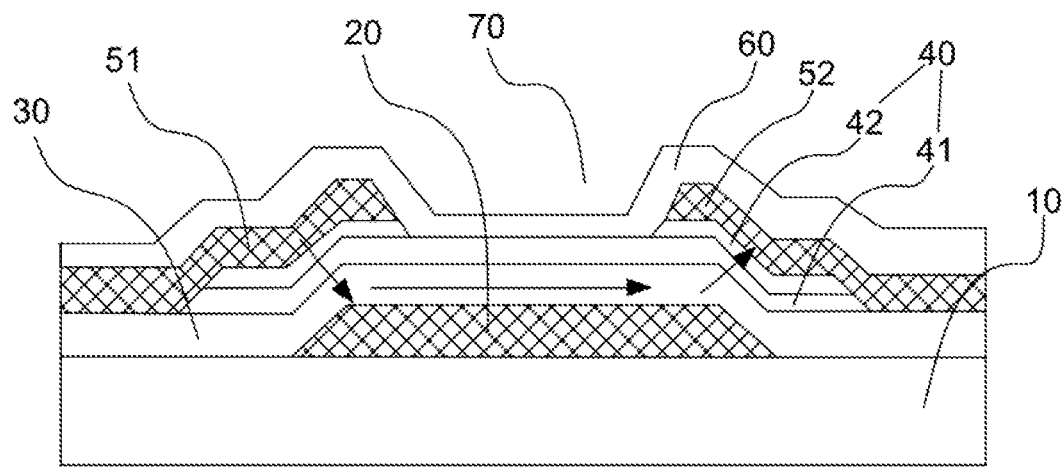
FIG. 4 is a schematic view showing flowing of electronic/hole in the TFT of the display panel according to the embodiment of this disclosure.
Figure 5:
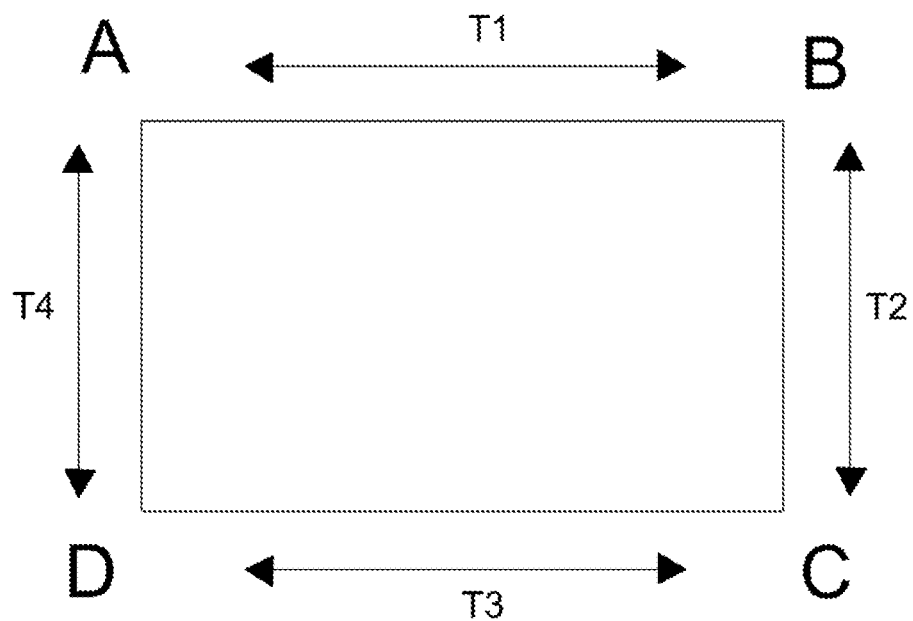
FIG. 5 is a schematic view showing dual analysis of the TFT of the display panel according to the embodiment of this disclosure.

Referring to FIGS. 3 to 5, a display panel of the disclosure includes a substrate 10, a first metal layer disposed on the substrate 10, an insulating layer 30 disposed on the first metal layer, a semiconductor layer 40 disposed on the insulating layer 30 and including a germanium-doped semiconductor compound, and a second metal layer disposed on the semiconductor layer 40. The mobility of the semiconductor compound is greater than the mobility of amorphous silicon.

The semiconductor layer 40 comprises an active layer 41 disposed on the insulating layer 30 and an N-typed doped layer 42 disposed on the active layer 41. The second metal layer is covered with a passivation layer 60. The passivation layer 60 is covered with a display electrode 80.

The first metal layer is a gate metal layer 20. The second metal layer comprises a source metal layer 51 and a drain metal layer 52 disposed on the N-typed doped layer 42. A trench 70 is also provided above the active layer 41. The trench 70 blocks the source metal layer 51 and the drain metal layer 52 and the N-typed doped layer 42. The portion of the display electrode 80 covering the drain metal layer 52 passes through the passivation layer 60 and is electrically connected to the source metal layer 51.

The insulating layer 30 comprises the oxygen-rich germanium-silicon compound. Both the active layer 41 and the N-typed doped layer 42 comprise the oxygen-rich germanium compound or the oxygen-rich germanium-silicon compound. The annealing temperatures (Depo. Temp) of these compounds generally range between 170° C. and 370° C.

The oxygen-rich germanium compound comprises, but without limitation to: GeOx; GeNx; GeOxNy; GeCx; GeOxCy; and GeOxNyCz.

The oxygen-rich germanium-silicon compound comprises, but without limitation to: SiGeOx; SiGeOxNy; SiGeNx; SiGeOxCy; SiGeCx; and SiGeOxNyCz.

FIG. 4 shows the flow direction of electrons and holes in the energized state, which reflects the high mobility of the TFT of this disclosure.

FIG. 5 is a schematic view showing four-dimensional engineering design control of the TFT, and showing the duality between the semiconductor (left side) and the dielectrics (right side) and illustrating the necessity of the application of germanium-rich compounds to the TFT, especially the active layer 41 of the TFT. The left side of the block diagram represents the duality Ge-rich TFT (G-TFT), and the right side thereof represents the Ge-Nanomaterial compound. Descriptions will be made by taking GeOx: Hy as an example, wherein A is Ge-Nanomaterial [Nano-Ge (conc.)], B is GeOx matrix, C is the interface, such as the Ge-Nanomaterial (Nano-Ge) or GeOx matrix of the active layer 41/the insulating layer 30, D represents H2 (conc.), T1 represents GeH4/N2O; T2 and T3 represent the TFT reliability, and T4 represents H2/GeH4.

Referring to FIGS. 3 to 5, a display panel of the disclosure includes a substrate 10, a first metal layer disposed on the substrate 10, an insulating layer 30 disposed on the first metal layer, a semiconductor layer 40 disposed on the insulating layer 30 and including a germanium-doped semiconductor compound, and a second metal layer disposed on the semiconductor layer 40. The mobility of the semiconductor compound is greater than the mobility of amorphous silicon.

The semiconductor layer 40 comprises an active layer 41 disposed on the insulating layer 30 and an N-typed doped layer 42 disposed on the active layer 41. The second metal layer is covered with a passivation layer 60. The passivation layer 60 is covered with a display electrode 80.

The first metal layer is a gate metal layer 20. The second metal layer comprises a source metal layer 51 and a drain metal layer 52 disposed on the N-typed doped layer 42. A trench 70 is also provided above the active layer 41. The trench 70 blocks the source metal layer 51 and the drain metal layer 52 and the N-typed doped layer 42. The portion of the display electrode 80 covering the drain metal layer 52 passes through the passivation layer 60 and is electrically connected to the source metal layer 51.

All of the insulating layer 30, the active layer 41 and the N-typed doped layer 42 comprise the GeOxNy compound. The annealing temperature thereof is controlled to range between 170° C. and 370° C. The same kind of germanium compounds can be used to simplify the process and decrease the manufacturing costs.

FIG. 4 shows the flow direction of electrons and holes in the energized state, which reflects the high mobility of the TFT of this disclosure.

FIG. 5 is a schematic view showing four-dimensional engineering design control of the TFT, and showing the duality between the semiconductor (left side) and the dielectrics (right side) and illustrating the necessity of the application of germanium-rich compounds to the TFT, especially the active layer 41 of the TFT. The left side of the block diagram represents the duality Ge-rich TFT (G-TFT), and the right side thereof represents the Ge-Nanomaterial compound. Descriptions will be made by taking GeOx: Hy as an example, wherein A is Ge-Nanomaterial [Nano-Ge (conc.)], B is GeOx matrix, C is the interface, such as the Ge-Nanomaterial (Nano-Ge) or GeOx matrix of the active layer 41/the insulating layer 30, D represents H2 (conc.), T1 represents GeH4/N2O; T2 and T3 represent the TFT reliability, and T4 represents H2/GeH4.

The display panel of the embodiment of this disclosure may be any of the following: the twisted nematic (TN) or super twisted nematic (STN) type, the in-plane switching (IPS) type, the vertical alignment (VA) type, and the curved panel.

The display panel in the embodiment of this disclosure can be used in a display device. The display device in the embodiment of this disclosure comprises the display panel described above. Detailed descriptions are made by taking the display panel as an example. It is to be described that the above-mentioned descriptions of the display panel structure are also applicable to the display device of the embodiment of this disclosure.

The display device of the embodiment of this disclosure may be a liquid crystal display, or an organic light-emitting diode (OLED) display. When the display device of the embodiment of this disclosure is the liquid crystal display, the liquid crystal display comprises a backlight module, and the backlight module can be used as a light source for providing the adequate brightness and uniform distribution. The backlight module of this embodiment may be of the front lighting type or the back lighting type. It is to be described that the backlight module of this embodiment is not limited thereto.

Figure 6:
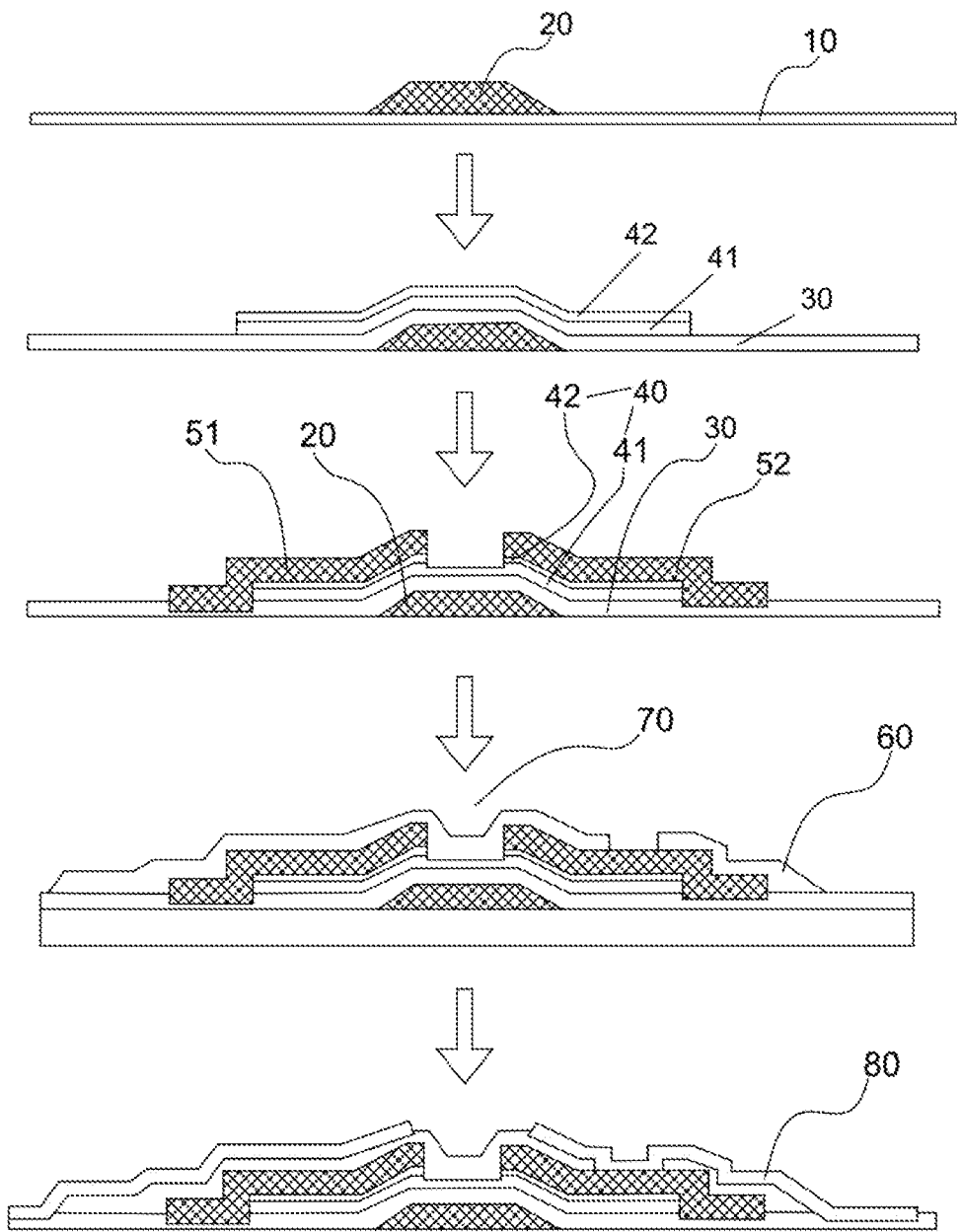
FIG. 6 is a flow schematic view showing a method of manufacturing a display panel according to an embodiment of this disclosure.
Figure 7:
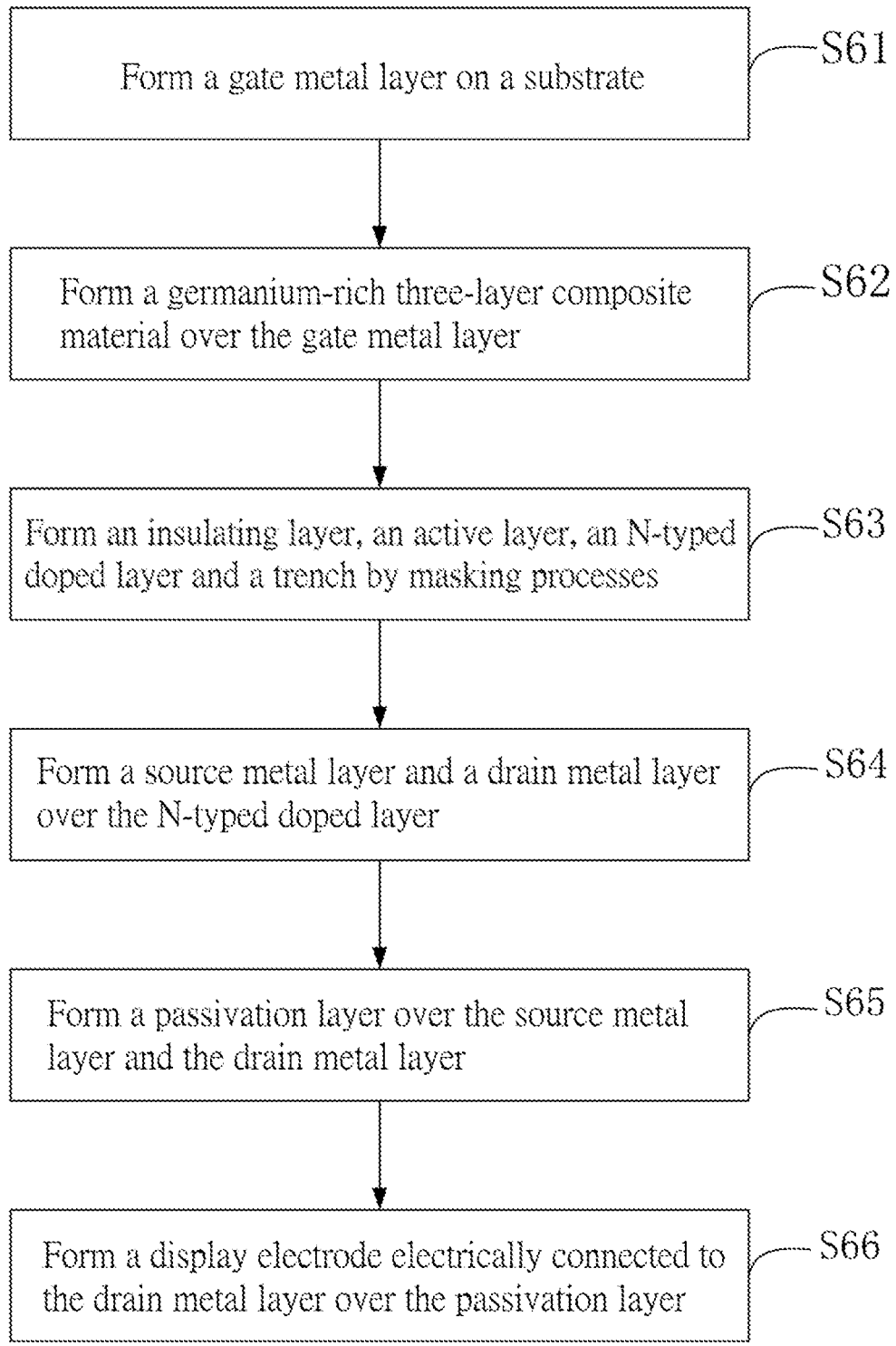
FIG. 7 is a schematic flow chart showing the processes of the method of manufacturing the display panel according to an embodiment of this disclosure.

As shown in FIGS. 6 and 7, the present embodiment also discloses a method of manufacturing a display panel. The method comprises the following steps.

In step S61, the gate metal layer 20 is formed on the substrate 10.

In step S62, a germanium-rich three-layer composite material is formed over the gate metal layer 20.

In step S63, the insulating layer 30, the active layer 41, the N-typed doped layer 42 and the trench 70 are formed by masking processes.

In step S64, the source metal layer 51 and the drain metal layer 52 are formed over the N-typed doped layer 42;

In step S65, the passivation layer 60 is formed over the source metal layer 51 and the drain metal layer 52.

In step S66, the display electrode 80 electrically connected to the drain metal layer 52 is formed over the passivation layer 60.

The insulating layer 30 comprises the oxygen-rich germanium-silicon compound. Both the active layer 41 and the N-typed doped layer 42 comprise the oxygen-rich germanium compound or the oxygen-rich germanium-silicon compound. The annealing temperatures (Depo. Temp) of these compounds generally range between 170° C. and 370° C.

The oxygen-rich germanium compound comprises, but without limitation to: GeOx; GeNx; GeOxNy; GeCx; GeOxCy; and GeOxNyCz.

The oxygen-rich germanium-silicon compound comprises, but without limitation to: SiGeOx; SiGeOxNy; SiGeNx; SiGeOxCy; SiGeCx; and SiGeOxNyCz.

Alternatively, the GeOxNy compound is adopted in all of the insulating layer 30, the active layer 41, and the N-type doped layer 42 in order to simplify the processes and decrease the manufacturing costs.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display panel, comprising:
a substrate having a plurality of pixel areas;
a first metal layer disposed on the substrate;
an insulating layer disposed on the first metal layer,
a semiconductor layer disposed on the insulating layer and comprising an oxygen-rich germanium-silicon compound; and
a second metal layer disposed on the semiconductor layer, wherein:
a mobility of the oxygen-rich germanium-silicon compound is greater than a mobility of amorphous silicon;
the semiconductor layer comprises an active layer disposed on the insulating layer and an N-typed doped layer disposed on the active layer, and the second metal layer is covered with a passivation layer; the second metal layer comprises a source metal layer and a drain metal layer disposed on the N-typed doped layer; and a trench is also provided above the active layer, and the trench blocks the source metal layer from the drain metal layer and the N-typed doped layer; and the insulating layer comprises the oxygen-rich germanium-silicon compound; and both the active layer and the N-typed doped layer comprise a germanium-doped semiconductor compound.

2. A display panel, comprising:
a substrate having a plurality of pixel areas;
a first metal layer disposed on the substrate;
an insulating layer disposed on the first metal layer,
a semiconductor layer disposed on the insulating layer and comprising a germanium-doped semiconductor compound; and
a second metal layer disposed on the semiconductor layer, wherein
a mobility of the semiconductor compound is greater than a mobility of amorphous silicon,
wherein the semiconductor layer comprises:
an active layer disposed on the insulating layer;
an N-typed doped layer disposed on the active layer; and
the active layer comprises the germanium-doped semiconductor compound.

3. The display panel according to claim 2, wherein the semiconductor compound of the semiconductor layer is an oxygen-rich germanium compound.

4. The display panel according to claim 2, wherein the semiconductor compound of the semiconductor layer is an oxygen-rich germanium-silicon compound.

5. The display panel according to claim 2, wherein the semiconductor compound of the active layer is an oxygen-rich germanium compound.

6. The display panel according to claim 2, wherein the semiconductor compound of the active layer is an oxygen-rich germanium-silicon compound.

7. The display panel according to claim 2, wherein the N-typed doped layer comprises an oxygen-rich germanium compound or an oxygen-rich germanium-silicon compound.

8. The display panel according to claim 2, wherein the insulating layer comprises an oxygen-rich germanium-silicon compound.

9. A display device, comprising a display panel, wherein the display panel comprises:
a substrate having a plurality of pixel areas;
a first metal layer disposed on the substrate;
an insulating layer disposed on the first metal layer,
a semiconductor layer disposed on the insulating layer and comprising a germanium-doped semiconductor compound; and
a second metal layer disposed on the semiconductor layer, wherein
a mobility of the semiconductor compound is greater than a mobility of amorphous silicon,
wherein the semiconductor layer comprises:
an active layer disposed on the insulating layer;
an N-typed doped layer disposed on the active layer; and
the active layer comprises the germanium-doped semiconductor compound.

10. The display device according to claim 9, wherein the semiconductor compound of the semiconductor layer is an oxygen-rich germanium compound.

11. The display device according to claim 9, wherein the semiconductor compound of the semiconductor layer is an oxygen-rich germanium-silicon compound.

12. The display device according to claim 9, wherein the semiconductor compound of the active layer is an oxygen-rich germanium compound.

13. The display device according to claim 9, wherein the semiconductor compound of the active layer is an oxygen-rich germanium-silicon compound.

14. The display device according to claim 9, wherein the N-typed doped layer comprises an oxygen-rich germanium compound or an oxygen-rich germanium-silicon compound.

15. The display device according to claim 9, wherein the insulating layer comprises an oxygen-rich germanium-silicon compound.

16. The display device according to claim 9, wherein the second metal layer is covered with a passivation layer; the second metal layer comprises a source metal layer and a drain metal layer disposed on the N-typed doped layer; and a trench is also provided above the active layer, and the trench blocks the source metal layer from the drain metal layer and the N-typed doped layer; and
the insulating layer comprises an oxygen-rich germanium-silicon compound; and both the active layer and the N-typed doped layer comprise the germanium-doped semiconductor compound.

* * * * *